United States Patent

Huang et al.

[11] Patent Number: 5,801,095
[45] Date of Patent: Sep. 1, 1998

[54] PRODUCTION WORTHY INTERCONNECT PROCESS FOR DEEP SUB-HALF MICROMETER BACK-END-OF-LINE TECHNOLOGY

[75] Inventors: Richard J. Huang, Milpitas; Christy M.-C. Woo, San Jose, both of Calif.

[73] Assignee: Advanced Micro Devices, Inc., Sunnyvale, Calif.

[21] Appl. No.: 710,071

[22] Filed: Sep. 10, 1996

Related U.S. Application Data

[63] Continuation of Ser. No. 470,302, Jun. 6, 1995, abandoned.

[51] Int. Cl.$^6$ .................................................. H01L 21/28
[52] U.S. Cl. ...................... 438/627; 438/629; 438/633; 438/648
[58] Field of Search ............................. 437/190, 189, 437/192, 195; 438/622, 627, 628, 629, 633, 643, 648, 612

[56] References Cited

U.S. PATENT DOCUMENTS

| | | | |
|---|---|---|---|
| 4,844,776 | 7/1989 | Lee et al. | 156/653 |
| 4,884,123 | 11/1989 | Dixit et al. | 437/190 |
| 4,931,411 | 6/1990 | Tigelaar et al. | 437/192 |
| 4,937,652 | 6/1990 | Okumura et al. | 437/189 |
| 5,094,980 | 3/1992 | Shepela | 437/189 |
| 5,124,780 | 6/1992 | Sandhu et al. | 437/190 |
| 5,204,286 | 4/1993 | Doan | 437/195 |
| 5,227,335 | 7/1993 | Holschwandner et al. | 437/192 |
| 5,284,799 | 2/1994 | Sato | 437/189 |
| 5,407,859 | 4/1995 | Lee et al. | 437/180 |
| 5,420,058 | 5/1995 | Lee et al. | 437/41 |

FOREIGN PATENT DOCUMENTS

| | | | |
|---|---|---|---|
| 1-232747 | 9/1989 | Japan | 437/190 |

OTHER PUBLICATIONS

Wolf, S., et al., Silicon Processing for the VLSI Era, Lattice Press, 1986, vol. 1, pp. 182–195, 399–405.
Wolf, S., Silicon Processing for the VLSI Era, Lattice Press, 1990, vol. 2, pp. 194–199.

*Primary Examiner*—T. N. Quach
*Attorney, Agent, or Firm*—Sawyer & Associates

[57] ABSTRACT

The present invention is directed to improving the throughput of the process for fabricating multilayer interconnects. Tungsten plugs, formed in contact/via openings etched in an interlayer dielectric, have been widely used in industry to form interconnection between different metal layers. An adhesion layer comprising a Ti/TiN stack is typically employed to support the adhesion of the tungsten plug in the contact/via openings. The present invention is directed to a process involving the formation of a Ti/TiN landing pad at the base of contact/via openings prior to the deposition of the interlayer dielectric. The process of the present invention enables the removal of the Ti under-layer and the reduction of the TiN thickness in the Ti/TiN stack. The throughput of the process for fabricating multilayer interconnects is thus greatly improved while the integrity of the devices are maintained.

11 Claims, 2 Drawing Sheets

PRODUCTION WORTHY INTERCONNECT PROCESS FOR DEEP SUB-HALF MICROMETER BACK-END-OF-LINE TECHNOLOGY

This is a continuation of application Ser. No. 08/470,302 filed on Jun. 6, 1995 abandoned.

CROSS-REFERENCE TO RELATED APPLICATION

This application is related to the application Ser. No. 08/466,649, U.S. Pat. No. 5,654,589, filed on even date herewith. That application concerns a technology which employs Ti/TiN stack interconnect structures as local interconnects and contact landing pads to simplify the process of fabricating multilayer interconnects, to allow for tighter lay-out rules for die-size reduction, as well as to reduce capacitance in integrated circuits. The present application is directed to the formation of a Ti/TiN landing pad at the base of contact and via openings in a dielectric to improve the throughput of the process for fabricating multilayer interconnects.

TECHNICAL FIELD

The present invention relates generally to semiconductor processing, and, more particularly, to improving the throughput of the process for fabricating multilayer interconnects in sub-half micrometer semiconductor devices.

BACKGROUND ART

To accommodate higher packing density in present integrated circuits, metal connection to the source, gate, and drain electrodes are made by multilayer interconnects. Each level of multilayer interconnects are supported over the semiconductor substrate by an interlayer dielectric. For sub-micrometer devices tungsten plugs have been widely used in industry to form interconnection between different metal layers.

The formation of a tungsten plug is accomplished by sequentially patterning and etching the interlayer dielectric to form contact and via openings and filling these openings by blanket tungsten deposition. Contact may thus be formed with previously-doped regions in the semiconductor substrate, polysilicon, or other metal layers.

Before blanket tungsten deposition, an adhesion layer is deposited on the interlayer dielectric. The adhesion layer typically comprises either a Ti/TiN stack or TiN, see, e.g., patent application Ser. No. 08/402,254, filed on Mar. 10, 1995, U.S. Pat. No. 5,625,231, by R. J. Huang et al, entitled "Low Cost Solution to High Aspect Ratio Contact/Via Adhesion Layer Application for Deep Sub-half Micrometer Back-end-of Line Technology". The Ti under-layer in the Ti/TiN stack serves mostly to improve contact/via resistance.

The current practice in the industry is to deposit a Ti/TiN layer after the contact/via openings are formed. The contact/via openings are then filled with tungsten metal by blanket tungsten deposition. The blanket tungsten deposition is followed by either plasma etchback or chemical mechanical polish (CMP) which removes the excess tungsten, TiN, and Ti.

As device geometry fast surpasses the half-micrometer benchmark, the short-falls of the plasma etchback approach are realized. These shortfalls include: (1) residues that cause metal shorts, (2) plug recess which affects the metal step coverage, and (3) the formation of seams at the center of the plug, which also affects the metal step coverage. These shortfalls of the plasma etchback approach are barriers to achieving high yields.

Chemical mechanical polish (or planarization) is widely accepted because it offers the advantage of providing defect reduction as well as improving surface planarity with little or no tungsten plug recess. Although CMP can achieve reasonably high polish rates on tungsten and TiN, the polish rate on Ti is very low. The low rate of polish for Ti greatly reduces the system throughput for CMP, hence increasing wafer processing cost.

What is needed is a means for enabling the removal of the Ti under-layer and the reduction of the TiN thickness in the Ti/TiN stack thus greatly improving CMP throughput.

DISCLOSURE OF INVENTION

In accordance with the invention, a process for forming multilayer interconnects is provided that enables the throughput of the CMP step to be increased. The process of the present invention involves the formation of a Ti/TiN landing pad at the base of the contact/via opening prior to the formation of the interlayer dielectric.

A multilayer interconnect structure contacting conductive regions separated by insulating regions supported over a semiconductor substrate is formed by a process comprising:

(a) forming a layer of Ti on the insulating regions and the conductive regions;

(b) forming a first layer of TiN on the layer of Ti;

(c) patterning and etching the layer of Ti and the first layer of TiN to localize the layer of Ti and the layer of TiN above the conductive regions;

(d) forming an interlayer dielectric over the semiconductor substrate;

(e) etching contact/via openings in the interlayer dielectric down to the first layer of TiN, each of the contact/via openings having a bottom and sidewalls;

(f) depositing a second layer of TiN such that the second layer of TiN is formed on the bottom and the sidewalls of the contact/via openings, the second layer of TiN serving as an adhesion layer; and (g) forming a metal plug in each the contact/via openings and adhered to the bottom and sidewalls thereof by the second layer of TiN.

The conductive regions may include doped regions in the semiconductor substrate, a titanium silicide layer over doped regions in the semiconductor substrate, a layer of polysilicon, a titanium polysilicide layer over a layer of polysilicon, or a metal layer.

The insulating regions may comprise oxide as in the case where the insulating regions are field oxide regions.

The metal plug is formed on the second layer of TiN by a process including blanket deposition of a metal in the contact/via openings followed by chemical mechanical polishing to remove metal and TiN outside the contact/via openings. The metal plug may comprise tungsten, copper, gold, and aluminum.

The process of the present invention enables the removal of the Ti under-layer and the reduction of the TiN thickness in the Ti/TiN stack. The CMP throughput is greatly improved yet the integrity of the devices are maintained. Difficulties with junction leakage at the contact level, and with $WF_6$ attacking the Ti on both the contact and via level, are avoided by using the process of the present invention. $WF_6$ is employed in the deposition of tungsten. Exposed Ti will react with WF$_6$ forming gaseous titanium fluoride which creates "volcanoes" and can cause "explosions", see, e.g., above-mentioned patent application Ser. No. 08/466, 649, U.S. Pat. No. 5,654,589. Complete coverage over the layer of Ti, provided by the process of the present invention, prevents WF$_6$ attack.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

The present invention is directed to a process involving the formation of a Ti/TiN landing pad at the base of contact or via openings in a dielectric. The Ti/TiN landing pad is formed prior to the deposition of the interlayer dielectric. Contact and via openings are formed in the dielectric and subsequently filled with plugs of an electrically conductive materials such as tungsten. The plugs may contact previously-doped regions, polysilicon, or other metal layers.

Some plugs contact a titanium silicide layer on doped regions in the semiconductor substrate and become source or drain contacts. Other plugs contact a polysilicon layer or a titanium silicide layer (i.e., a titanium polysilicide layer) on a polysilicon layer which is formed over a thin oxide gate layer. These plugs become gate electrodes. Openings etched down to the gate or to the source/drain junction, which may have a titanium silicide layer (or a titanium polysilicide layer) on top, are termed hereinafter "contact" openings. Openings etched down to a metal layer or a TiN ARC (anti-reflection coating) on top of a metal layer are termed hereinafter "via" openings. The term "contact/via" will hereinafter be equated with "contact and/or via".

Figure 1A:
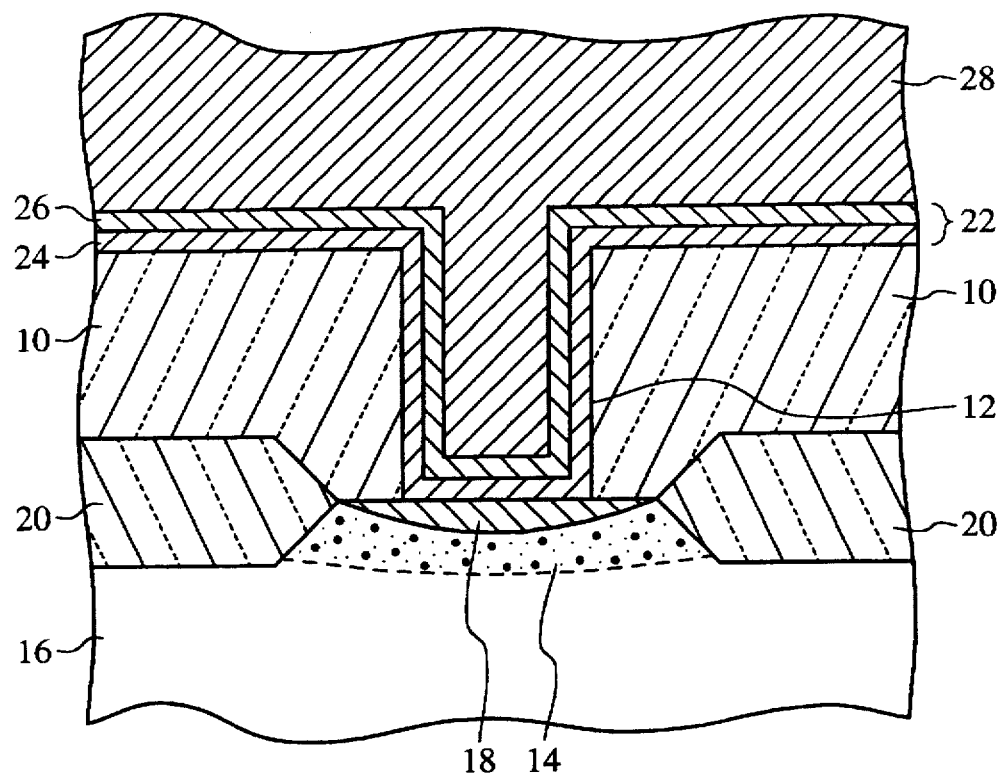
FIGS. 1a–1b are cross-sectional views depicting a prior art process and the resulting structure.
Figure 1B:
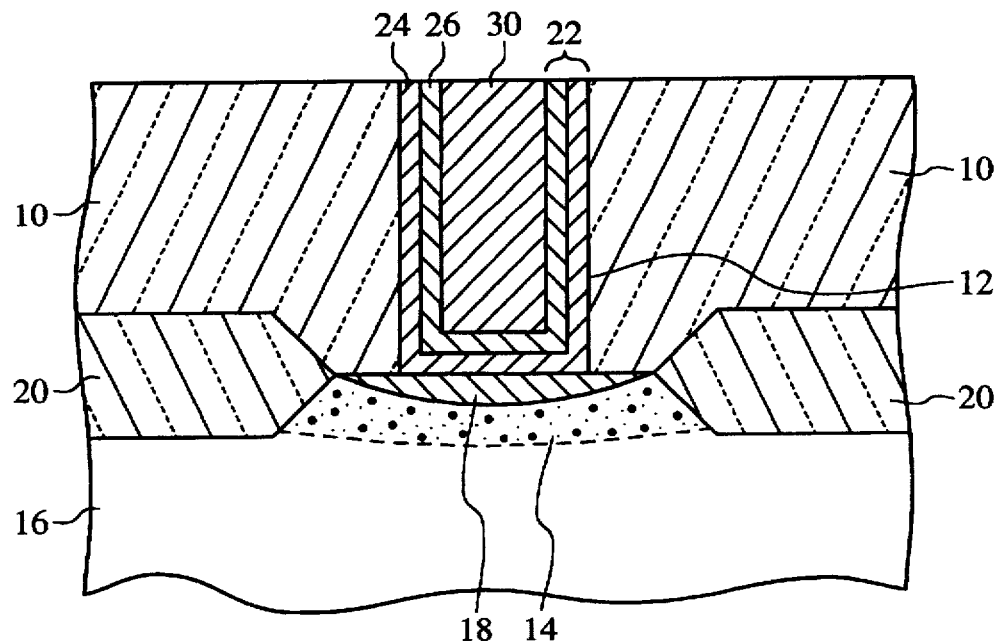

Cross-sectional views of the present prior art approach are depicted in FIGS. 1a and 1b. The prior art approach to contact/via formation involves depositing an adhesion layer comprising a Ti/TiN stack after the contact/via openings are formed.

FIG. 1a shows a region of the integrated circuit where a portion of a interlayer dielectric 10 has been etched to form a contact/via opening 12 over a conductive region (i.e., doped region) 14 in a semiconductor substrate 16. While one such contact/via opening 12 is shown, it will be readily apparent to those skilled in this art that in fact a plurality of such contact/via openings are formed. The interlayer dielectric 10 has been etched down to a titanium silicide layer 18, formed on the doped region 14 which resides between insulating regions (i.e., field oxide regions) 20. An adhesion layer 22 (or adhesion/barrier layer) comprising a Ti/TiN stack is deposited on the interlayer dielectric 10. The Ti/TiN stack, which comprises a Ti under-layer 24 and an upper layer of TiN 26, serves to structurally support the adhesion of a layer of tungsten 28 blanket deposited over the interlayer dielectric 10. FIG. 1a illustrates the structure of the device at this stage of processing.

The blanket tungsten deposition is followed by either plasma etchback or CMP to remove the excess tungsten resulting in the formation of a metal plug 30 (shown in FIG. 1b) in the contact/via opening 12. In this case, the metal plug 30 comprises tungsten, however, the metal plug may comprise other metals such as copper, gold, and aluminum. Accordingly, a layer of copper, gold, or aluminum must be blanket deposited in place of the layer of tungsten 28. The plasma etchback or CMP also removes the excess TiN and Ti formed on the surface of the interlayer dielectric 10 that remains outside of the contact/via opening 12. FIG. 1b illustrates the structure of the device at this stage of processing.

The present invention is directed to a process which enables the elimination of the Ti under-layer 24 as a component in the Ti/TiN stack that serves as the adhesive layer 22. The present invention further enables the thickness of the upper layer of TiN 26 in the Ti/TiN stack to be reduced to 50 Å from the current 800 to 1,000 Å

Figure 2A:
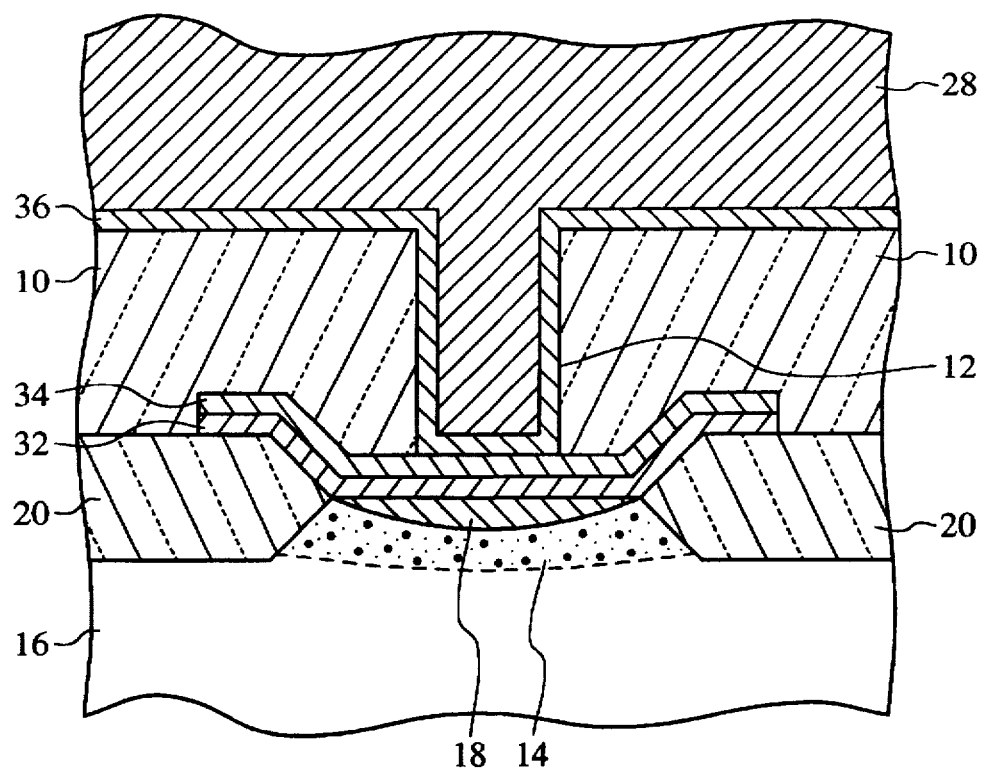
FIGS. 2a–2b are cross-sectional views depicting a process of the invention and the resulting structure.
Figure 2B:
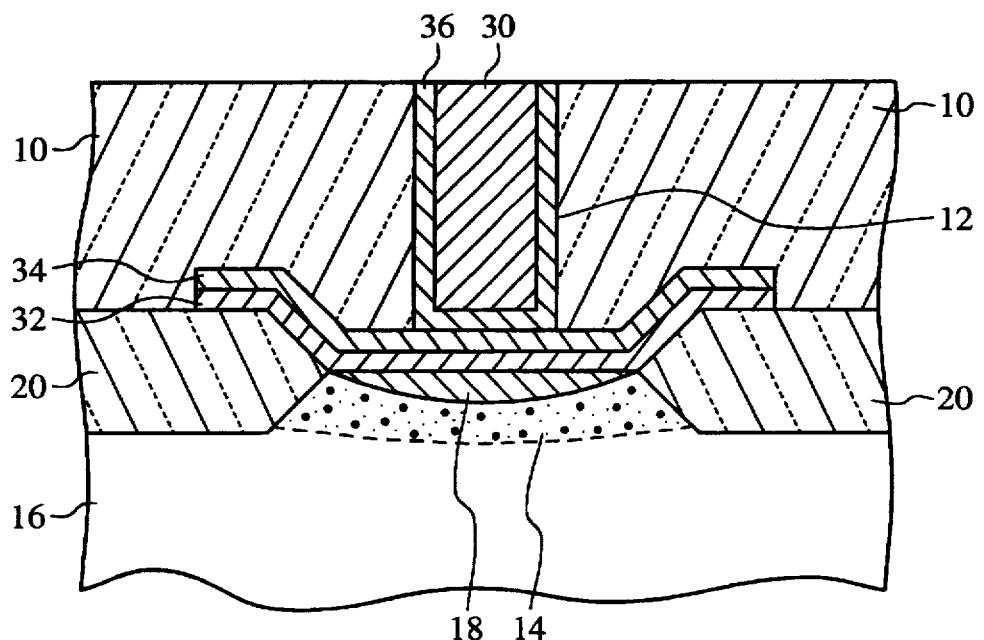

The process of the present invention involves the formation of the Ti/TiN landing pad at the base of the contact/via opening 12 prior to the deposition of the interlayer dielectric 10. The contact level process flow of the present invention is depicted in FIGS. 2a and 2b. In the case where source and drain contacts are to be made, the titanium silicide layer 18 is formed on the doped region 14 in the semiconductor substrate 16 as shown in FIG. 2a. While one such doped region 14 is shown, it will be readily apparent to those skilled in this art that in fact a plurality of such doped regions exist on the semiconductor substrate 16 of an integrated circuit. The titanium silicide layer 18 is formed over the p$^+$ or n$^+$ doped region 14 in the semiconductor substrate 16 which resides between the field oxide regions 20. The formation of the titanium silicide layer 18 by rapid thermal anneal is followed by the deposition of a layer of Ti 32 and a first layer of TiN 34.

A resist (not shown) is employed to pattern and etch the layer of Ti 32 and the first layer of TiN 34 such that they are localized above the titanium silicide layer 18 which covers the doped region 14. Once patterned, the layer of Ti 32 and the first layer of TiN 34 together, comprise the Ti/TiN landing pad.

Next, after stripping off the resist, the interlayer dielectric 10 comprising an oxide (e.g., boron phosphorous silane-based glass (BPSG), boron phosphorous tetraethyl orthosilicate (BP-TEOS), etc.) is deposited over the semiconductor substrate 16 on the surface of the field oxide regions 20 and the Ti/TiN landing pad. The contact/via opening 12 is formed in the interlayer dielectric 10 by employing an etch that stops on the first layer of TiN 34.

A second layer of TiN 36 can be then deposited on the first layer of TiN 34 and on the sidewalls of the contact/via opening 12. This second layer of TiN 36 is thin in comparison with the first layer of TiN 34. More importantly, the thickness of the second layer of TiN 36 is reduced in comparison with the upper layer of TiN 26 in the Ti/TiN stack that serves as the adhesive layer 22 in the prior art process. In the present invention, the second layer of TiN 36 alone serves as the adhesion layer 22 for the layer of tungsten 28 blanket deposited over the interlayer dielectric 10. FIG. 2a illustrates the structure of the device at this stage of processing.

The blanket tungsten deposition is followed by CMP to remove the excess tungsten resulting in the formation of the metal plug 30 in the contact/via opening 12. In this case, the metal plug 30 comprises tungsten, however, the metal plug may comprise other metals such as copper, gold, and aluminum. Accordingly, a layer of copper, gold, or aluminum must be blanket deposited in place of the layer of tungsten 28.

The CMP also removes the excess TN formed on the surface of the interlayer dielectric 10 that remains outside of the contact/via opening 12. The reduced thickness of this excess TiN, in comparison with the prior art process, will increase the CMP throughput. FIG. 2b illustrates the structure of the device at this stage of processing.

A similar process for providing the Ti/TiN landing pad on the bottom of the contact/via opening 12 is applicable to the formation of metal plugs 30 that contact a polysilicon layer. In this case, the Ti/TiN landing pad may be formed on a titanium polysilicide layer on the polysilicon or on the polysilicon layer itself which is formed over a thin oxide layer above the semiconductor substrate 16. The process of the present invention is also applicable to the formation of a Ti/TiN landing pad at the base of a contact/via opening 12 which contacts a metal layer such as a metal interconnect. It is possible to form a Ti/TiN landing pad on an Al layer and use the Al/Ti/TiN structure as a landing stack.

The present invention provides several advantages over the prior art process:

1. Without the Ti under-layer 24 in the adhesive layer 22, the tungsten CMP throughput is increased by at least 40%, and possibly as high as 50% to 60%, depending on the chemistry.
2. Further increase in CMP throughput is achieved by reducing the thickness of the upper layer of TiN 26 in the adhesive layer 22.
3. Removing the Ti under-layer 24 and reducing the thickness of the upper layer of TiN 26 in the adhesive layer 22 will reduce the overhang of the adhesion layer over the contact/via opening 12 and subsequently reduce the seam size at the center of the metal plug 30.
4. The process of the present invention increases the throughput of physical vapor deposition (PVD) tools hence reducing processing cost.

INDUSTRIAL APPLICABILITY

The process of the invention for forming a Ti/TiN landing pad at the base of contact/via openings is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for forming multilayer interconnect structures contacting conductive regions separated by insulating regions supported over a semiconductor substrate comprising:

(a) forming a layer of Ti on said insulating regions and said conductive regions;

(b) forming a first layer of TiN on said layer of Ti;

(c) patterning and etching said layer of Ti and said first layer of TiN to localize said layer of Ti and said layer of TiN above said conductive regions;

(d) forming an interlayer dielectric over said semiconductor substrate;

(e) etching contact/via openings in said interlayer dielectric down to said first layer of TiN, each of said contact/via openings having a bottom and sidewalls;

(f) depositing a second layer of TiN such that said second layer of TiN is formed on said bottom and said sidewalls of said contact/via openings, said second layer of TiN serving as an adhesion layer; and (g) forming a metal plug in each said contact/via openings and adhered to said bottom and sidewalls thereof by said second layer of TiN.

2. The process of claim 1 wherein said conductive regions are selected from the group consisting of doped regions in said semiconductor substrate, a titanium silicide layer over doped regions in said semiconductor substrate, a layer of polysilicon, a titanium polysilicide layer over a layer of polysilicon, or a metal layer.

3. The process of claim 1 wherein said insulating regions comprise an oxide.

4. The process of claim 1 wherein said metal plug is formed on said second layer of TiN by a process including blanket deposition of a metal in said contact/via openings.

5. The process of claim 4 wherein said metal plug is formed by chemical mechanical polishing to remove metal and TiN outside said contact/via openings.

6. The process of claim 1 wherein said metal plug comprises essentially of a metal from the group consisting of tungsten, copper, gold, and aluminum.

7. The process of claim 6 wherein said conductive regions are selected from the group consisting of doped regions in said semiconductor substrate, a titanium silicide layer over doped regions in said semiconductor substrate, a layer of polysilicon, a titanium polysilicide layer over a layer of polysilicon, or a metal layer.

8. The process of claim 1 wherein said second layer of TiN is thinner than said first layer of TiN.

9. A process for employing chemical mechanical polishing to form metal plugs in contact/via openings in an interlayer dielectric, said metal plugs contacting conductive regions separated by insulating regions supported over a semiconductor substrate comprising:

(a) forming a layer of Ti on said insulating regions and said conductive regions;

(b) forming a first layer of TiN on said layer of Ti;

(c) patterning and etching said layer of Ti and said first layer of TiN to form Ti/TiN landing pads, each of said Ti/TiN landing pads contacting one of said conductive regions;

(d) forming said interlayer dielectric over said semiconductor substrate;

(e) etching said contact/via openings in said interlayer dielectric down to said first layer of TiN, each of said contact/via openings having a bottom and sidewalls;

(f) depositing a second layer of TiN which is thinner than said first layer of TiN such that said second layer of TiN is formed on said bottom and said sidewalls of said contact/via openings, said second layer of TiN serving as an adhesion layer;

(g) blanket depositing a metal over said interlayer dielectric and in said contact/via openings; and (h) removing metal and TiN outside said contact/via openings by chemical mechanical polishing thereby forming said metal lugs in said contact/via openings and adhered to said bottom and sidewalls thereof by said second layer of TiN.

10. The process of claim 9 wherein said insulating regions comprise an oxide.

11. The process of claim 9 wherein said metal plug comprises essentially of a metal from the group consisting of tungsten, copper, gold, and aluminum.

* * * * *